(12) United States Patent
Lin et al.

(10) Patent No.: US 6,720,614 B2
(45) Date of Patent: Apr. 13, 2004

(54) OPERATION METHOD FOR PROGRAMMING AND ERASING A DATA IN A P-CHANNEL SONOS MEMORY CELL

(75) Inventors: Hung-Sui Lin, Hsin-Ying (TW); Nian-Kai Zous, Tauyuan Hsien (TW); Han-Chao Lai, Taichung (TW); Tao-Cheng Lu, Kaoshiung (TW)

(73) Assignee: Macronix International Co., Ltd., Hsinchu (TW)

( * ) Notice: Subject to any disclaimer, the term of this patent is extended or adjusted under 35 U.S.C. 154(b) by 181 days.

(21) Appl. No.: 10/005,270

(22) Filed: Dec. 4, 2001

(65) Prior Publication Data

US 2003/0036250 A1 Feb. 20, 2003

(30) Foreign Application Priority Data

Aug. 7, 2001 (TW) .................................... 90119204 A

(51) Int. Cl.$^7$ ............................................. H01L 29/788
(52) U.S. Cl. ................. 257/316; 257/324; 257/322; 257/321; 365/185.29; 365/185.19; 365/185.27; 365/185.03
(58) Field of Search ................. 438/786; 257/316, 257/324, 335, 322, 321; 365/185.29, 185.19, 185.27, 185.03

(56) References Cited

U.S. PATENT DOCUMENTS 6,366,501 B1 * 4/2002 Thurgate et al. ........ 365/185.29

* cited by examiner

*Primary Examiner*—Matthew Smith
*Assistant Examiner*—V. Yevsikov
(74) *Attorney, Agent, or Firm*—J. C. Patents

(57) ABSTRACT

A method for operating a P-channel SONOS memory device that has a charge trapping layer located on a substrate, a gate electrode located on the trapping layer, two doped regions located in the substrate at each side of the charge trapping layer. The two doped regions are set to be a drain region and a source region. When a programming action is intended, the gate electrode and the drain region are applied with a first negative high-level bias, and the source region and the substrate are applied with a grounded voltage. When an erasing action is intended, the gate electrode is a second negative bias which is smaller than the first negative voltage in absolute value. In the mean time, the drain region is applied with the third negative bias and the substrate is applied with a grounded voltage. The third negative voltage is larger than the second negative bias in absolute value.

12 Claims, 2 Drawing Sheets

OPERATION METHOD FOR PROGRAMMING AND ERASING A DATA IN A P-CHANNEL SONOS MEMORY CELL

CROSS-REFERENCE TO RELATED APPLICATION

This application claims the priority benefit of Taiwan application serial no. 90119204, filed Aug. 7, 2001.

BACKGROUND OF THE INVENTION

1. Field of Invention

The present invention relates to semiconductor fabrication. More particularly, the present invention relates to a method for programming and erasing data in a ROM with a silicon-ONO-silicon (SONOS) structure, which is a p-channel NROM having two bits in one memory cell.

2. Description of Related Art

Memory devices for non-volatile storage of information are currently in widespread use today with various applications. For example, as the function of a microprocessor is more and more powerful, it usually need more software programs to perform these functions. And then, it needs a lot of memory to store all the programs and related information.

In order to increase the memory size, the dimension of the memory devices is greatly reduced. However, for the rather conventional memory structure, each memory cell can only serve as one bit for storing information.

Recently, a type of memory structure, so called an N-channel silicon-Oxide/Nitride/Oxide-silicon (SONOS) ROM, that is also called N-channel NROM, has been introduced, where the ONO layer serves as charge trapping layer to store two bit data. The N-channel SONOS ROM allows one memory cell to have two bits during writing data but the data cannot erased bit by bit. A conventional N-channel NROM and its operation for writing data is described in FIG. 1.

In FIG. 1, a substrate 100 is provided. An oxide/nitride/oxide (ONO) layer 110 is formed on the substrate 100, where the ONO layer serving as a trapping layer 110 includes an oxide layer 104, a nitride layer 106, and another oxide layer 108. Two N+ doped regions 102a, 102b are formed in the substrate 100 at each side of the trapping layer 110. A polysilicon gate layer 112 doped with N-type dopants is formed on the trapping layer 110. For this structure of the memory cell, it has an I-V curve as shown in FIG. 2. When a bias of 9 volts is applied to the gate layer 112, a hot electrons would occur.

When the memory cell as shown in FIG. 1 is to programmed with data or the data is to be erased, it can be achieved by setting proper the biases for Vd, Vg, Vs, and $V_B$. If the doped region 102a be set to be drain region and the doped region 102b is set to be source region, the bias relation between programming/erasing (P/E) operation is illustrated as table 1.

TABLE 1

|  | Vg | Vd | Vs | $V_B$ |
| --- | --- | --- | --- | --- |
| Programming | 9 V | 9 V | 0 V | 0 V |
| Erasing | 0 V | 9 V | Floating | 0 V |

When the biases are set to be Vg=Vd=9V and Vs=$V_B$=0V, hot electrons are generated and then are trapped inside the nitride layer 106 near the drain region 102a as shown in a shaded area 114. When the data is to be erased, the hot electrons should be removed away. Usually, a band to band hot carrier mechanism is used to erase the data. The gate electrode and the substrate are grounded. The drain region is applied with a bias of 9V. The source region is set to be floating. In this manner, the hot holes are generated and driven into the ONO layer, whereby the hot electrons are annihilated away. However, the electrons stored in adjacent cell would be affected during erasing. This causes that the erasing operation can only erases a block of data. There is no way to erase a single bit. In other words, a single bit operation is not possible during erasing.

Alternatively, if the doped region 102a and the doped region 102b are serving as a source region and a drain region in reverse order, another bit could be formed at the opposite side of the nitride layer 106. This allows two bits in one cell. However, the erasing operation is also in block operation.

For a P-channel NROM that is similar to an N-channel NROM but the doped type is different. For the conventional operation method, the Fowler-Nordheim (F-N) tunneling mechanism is used to write and erase data. The electrons generated under the F-N tunneling mechanism are not localized and flow to the whole cell. Therefore, it has the memory function with only one bit in one cell.

In the foregoing NROM, the conventional operation to operate P/E function still cannot achieve a complete single bit operation.

SUMMARY OF THE INVENTION

The invention provides an operation method on an P-channel SONOS memory device, so that a single bit operation can be achieved.

As embodied and broadly described herein, the invention provides a method to perform an P/E operation on a P-channel SONOS memory device. The method includes providing a P-channel SONOS memory device that has a charge trapping layer located on a substrate, a gate electrode located on the trapping layer, two doped regions located in the substrate at each side of the charge trapping layer. While one of the two doped regions is set to be a drain region, the other one of the two doped regions serves as a source region. When a programming action is intended, the gate electrode and the drain region are applied with a first negative bias, and the source region and the substrate are applied with a grounded voltage. The first negative voltage is sufficient to drive hot electrons into a trapping layer. When an erasing action is intended, the gate electrode is a second negative bias which is smaller than the first negative bias in absolute value. In the mean time, the drain region is applied with the a third negative bias and the substrate are applied with a grounded voltage. The third negative bias is larger than second negative bias in absolute value, so that the bias difference is sufficient to cause the hot electrons to flow into the trapping layer.

In the foregoing, the operation can be repeated but the source region and the drain region are reversed, whereby the P/E action is operated with respect to another bit in the same cell.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

In order to increase memory capacity, the invention a novel operation on a P-channel SONOS memory device, so as to have two storage bits. Data stored on each memory cell as a bit can be erased bit by bit, so that the operation of single bit program can be achieved. An example is provided for describing the features of the invention as follows.

Figure 1:
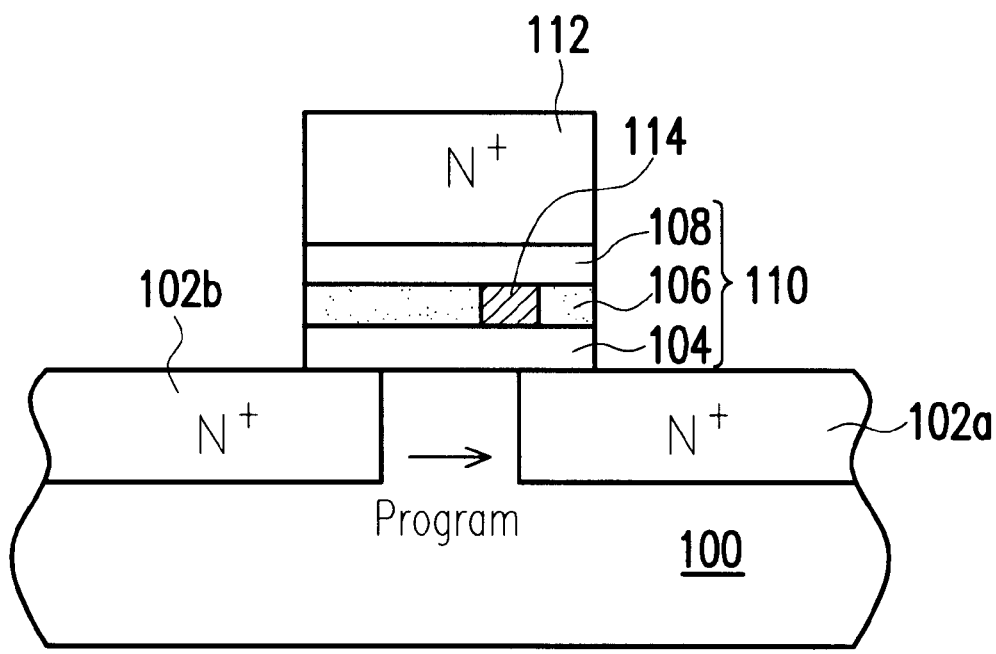
FIG. 1 is a cross-sectional view, schematically illustrating a structure of an N-channel NROM.
Figure 2:
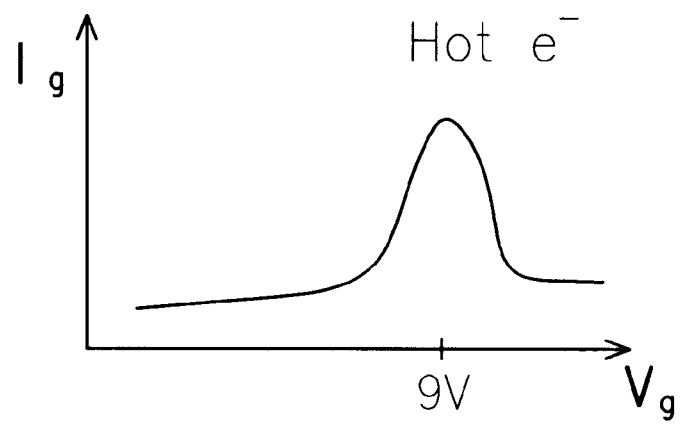
FIG. 2 is a Ig-Vg curve for the operation of the N-channel NROM in FIG. 1.
Figure 3:
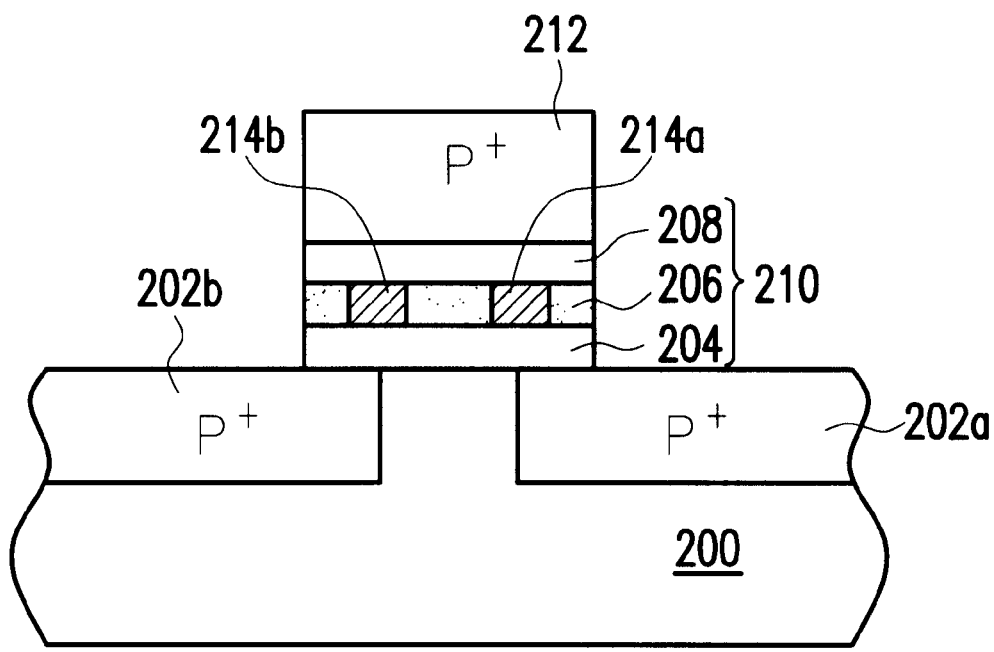
FIG. 3 is a cross-sectional view, schematically illustrating a structure of a P-channel NROM with two bit storing function, according to an embodiment of the present invention.

FIG. 3 is a cross-sectional view, schematically illustrating a structure of a P-channel NROM with two bit storing function, according to an embodiment of the present invention. In FIG. 3, a P-channel SONOS memory device includes a substrate 200, an ONO layer 210 on the substrate 200, a gate electrode 212 on the ONO layer 210. The ONO layer 210 is a structure of oxide/nitride/oxide including an oxide layer 204, a nitride layer 206, and an oxide layer 208. In addition, there are two P+ doped regions 202a, 202b in the substrate at each side of the ONO layer 210. The gate electrode 212 includes, for example, a polysilicon layer doped with P-type dopants at a level of P+. The drain region is the selected one of the two doped regions 202a, 202b. Then, the other one of the two doped regions 202a, 202b serves as the source region. For example, if the bit 214a is to be operated, the drain region is the doped region 202a and the source region is the doped region 202b. When the other bit 214b is to be operated, alternatively, the drain region is the doped region 202b and the source region is the doped region 202a.

Figure 4:
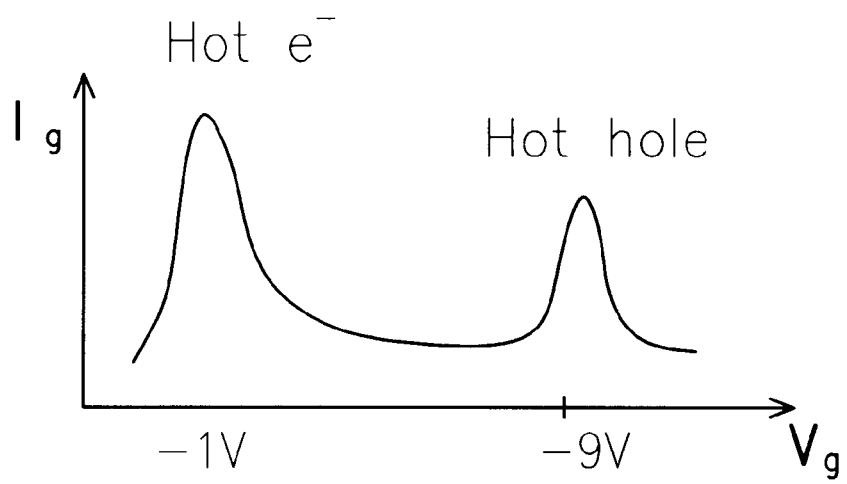
FIG. 4 is a Ig-Vg curve for the operation of the P-channel SONOS memory device in FIG. 3, according to an embodiment of the present invention.

In this invention, the P-channel SONOS memory device can be operated by a specific biases so as to have two bits 214a, 214b for storing data and each bit can be erased separately. FIG. 4 is a Ig-Vg curve for the operation of the P-channel SONOS memory device in FIG. 3, according to an embodiment of the present invention. The P-channel SONOS memory device has the hot electrons and hot holes, which are generated at different bias configuration for the Vg, Vs, Vd, and $V_B$, with respect to applied biases on the gate electrode 212, the source region, the drain region, and the substrate 200. In FIG. 4, hot holes can be generated when the gate electrode is applied with a bias of, for example, −9V, while hot electrons can be generated when the gate electrode is applied with a bias of, for example, −1V. The hot electrons has lower working voltage than the working voltage to produce the hot holes in absolute value.

Based on the property of I-V curve in FIG. 4, the hot holes can be stored in the nitride layer 206 of the ONO layer 210 near the selected drain region, such as the doped region 214a. If one wants to program the bit 214a, the doped region 202a is set to be the drain region, and the doped region 202b is set to be the source region. The bias configuration shown in table 2 illustrates a condition for performing the programming action and the erasing action.

TABLE 2

|  | Vg | Vd | Vs | $V_B$ |
|---|---|---|---|---|
| Programming | −9 V | −9 V | 0 V | 0 V |
| Erasing | −1 V | −9 V | Floating | 0 V |

When the programming action is intended, the biases of Vg and Vd are both set to be a first negative voltage, such as −9V. In this manner, hot holes are driven and accumulated in the nitride layer 206 (see FIG. 3) at the bit 214a near the drain region 202a. When the data at the bit 214a is to be erased, the hot holes accumulated at the bit 214a are necessary to be annihilated away. The erasing mechanism is driving hot electrons to the bit 214a for erasing the data. In this purpose, the biases are set, for example, Vg=−1 V, Vd=−9 V, Vs at floating, and $V_B$=0 V. The hot electrons are generated and conducted to the place for the bit 214a for annihilating the hot holes there. After annihilation between electrons and holes, the data is erased.

If one wants to program the other bit 214b, the doped region 202b is selected to serve as a drain region, while the doped region 202a serves as the source region. The bias configuration is the same as shown in table 2.

The mechanism to store another bit 214b is the same. Since the applied biases can produce a stronger electric field near the drain region and generate hot holes at the channel region, the hot holes are attracted by the negative bias applied at the gate and then pass through the tunneling oxide 204. As a result, the hot holes can be trapped therein in the nitride layer 206 which is an insulating layer. The hot holes would be localized and store the data of, for example, "1". Similarly, when the erasing action is operated, hot electrons are also locally generated and locally flow to the bit location near the drain region in the silicon nitride layer 206. The other bit near the source region is not affected. Therefore, the erasing action can performed bit by bit without affecting the adjacent bits. This operation is called a single bit operation in the invention. The conventional manner for erasing the data should be block by block since it uses the F-N tunneling mechanism to erase the data. The electrons generated under the F-N tunneling mechanism are not localized and then affect the adjacent bits and cells.

In the SONOS memory device, the nitride layer of the ONO layer serves as a floating gate to record the data. Since the hot holes can be locally controlled near to the drain region, there are two bit in one cell. When the data are written or erased according to the foregoing operation method. The data can be read by a conventional way.

In summary, the present invention employs an SONOS memory device for two storing bits in one memory cell. The hot holes are used to write data into one bit near the drain region at a time. The hot electrons are used to erase the data stored on one bit near the drain region at a time.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. An operation method for programming and erasing a data in a P-channel silicon-ONO-silicon (SONOS) memory cell, wherein the SONOS memory cell comprises a substrate, an ONO layer on the substrate, a gate electrode layer, and two doped regions in the substrate at each side of the ONO layer, the operation method comprising:

assigning a drain region and a source region to the two doped regions;

locally trapping hot holes into the ONO layer at a first bit region near the drain region when a programming action is intended, wherein the step of trapping hot holes into the ONO layer comprises a bias setting configuration that the gate electrode and the drain region both are set to a first negative voltage level, and the source region is set to a grounded voltage, and wherein the first negative voltage level is sufficient to cause the hot electrons to flow into the ONO layer; and driving hot electrons locally to the ONO layer near the drain region, whereby the hot holes are annihilated away when an erasing action is intended.

2. The operation method of claim 1, wherein the first negative voltage level is −9 V.

3. The operation method of claim 1, wherein a second bit region in the P-channel SONOS memory device is programmed and erased by a reverse assigning order of the source region and the drain region with respect to the two doped regions.

4. An operation method for programming and erasing a data in a P-channel silicon-ONO-silicon (SONOS) memory cell, wherein the SONOS memory cell comprises a substrate, an ONO layer on the substrate, a gate electrode layer, and two doped regions in the substrate at each side of the ONO layer, the operation method comprising:

assigning a drain region and a source region to the two doped regions;

locally trapping hot holes into the ONO layer at a first bit region near the drain region when a programming action is intended; and driving hot electrons locally to the ONO layer near the drain region, whereby the hot holes are annihilated away when an erasing action is intended, wherein the step of driving hot electrons locally to the ONO layer comprises a bias setting configuration that the drain region is set to a first negative voltage level, the gate electrode is set to a second negative voltage level, and the substrate is set to a grounded voltage, wherein the first negative voltage level is larger in absolute value than the second negative voltage level, and wherein a difference between the first negative voltage level and the second negative voltage level is sufficient to generate the hot electrons and drive the hot electrons into the ONO layer.

5. The operation method of claim 4, wherein the first negative voltage level is −9 V and the second negative voltage level is −1V.

6. The operation method of claim 4, wherein a second bit region in the P-channel SONOS memory device is programmed and erased by a reverse assigning order of the source region and the drain region with respect to the two doped regions.

7. A method for programming and erasing a data on a P-channel silicon-ONO-silicon (SONOS) memory cell, wherein the SONOS memory cell comprises a substrate, an ONO layer on the substrate, a gate electrode layer, and two doped regions in the substrate at each side of the ONO layer, the operation method comprising:

assigning one of the two doped regions to be a source region and then another one of the two doped regions to be a drain region;

programming the memory cell at a first bit region near the drain region by applying a first bias configuration to the gate electrode, the drain region, the source region, and the substrate, whereby hot holes are driven into the ONO layer, wherein the first bias configuration in the step of programming the memory cell comprises setting the gate electrode and the drain region to be a first negative voltage level, and setting the source region and the substrate to a grounded voltage, wherein the first negative voltage level is sufficient to generate the hot electrons and drive the hot electrons into the ONO layer; and driving hot electrons locally into the first bit of the ONO layer by applying a second bias configuration to the gate electrode, the drain region, the source region, and the substrate, whereby the hot holes at the first bit region are annihilated away when an erasing action is intended.

8. The method of claim 7, wherein the first negative voltage level is −9 V.

9. The operation method of claim 7, wherein a second bit region in the P-channel SONOS memory device is programmed and erased by a reverse assigning order of the source region and the drain region with respect to the two doped regions.

10. A method for programming and erasing a data on a P-channel silicon-ONO-silicon (SONOS) memory cell, wherein the SONOS memory cell comprises a substrate, an ONO layer on the substrate, a gate electrode layer, and two doped regions in the substrate at each side of the ONO layer, the operation method comprising:

assigning one of the two doped regions to be a source region and then another one of the two doped regions to be a drain region;

programming the memory cell at a first bit region near the drain region by applying a first bias configuration to the gate electrode, the drain region, the source region, and the substrate, whereby hot holes are driven into the ONO layer; and driving hot electrons locally into the first bit of the ONO layer by applying a second bias configuration to the gate electrode, the drain region, the source region, and the substrate, whereby the hot holes at the first bit region are annihilated away when an erasing action is intended, wherein the second bias configuration in the step of driving hot electrons locally into the first bit region of the ONO layer comprises setting the drain region is set to a first negative voltage level, setting the gate electrode to a second negative voltage level, and setting the substrate to a grounded voltage, wherein the first negative voltage level is larger in absolute value than the second negative voltage level, and a difference between the first negative voltage level and the second negative voltage level is sufficient to generate the hot electrons and drive the hot electrons into the ONO layer.

11. The method of claim 10, wherein the first negative voltage level is −9 V and the second negative voltage level is −1V.

12. The method of claim 10, wherein a second bit region in the P-channel SONOS memory device is programmed and erased by a reverse assigning order of the source region and the drain region with respect to the two doped regions.

* * * * *